(12) United States Patent
Franklin et al.

(10) Patent No.: US 9,153,320 B2
(45) Date of Patent: Oct. 6, 2015

(54) PROGRAMMING MEMORY CELLS USING A PROGRAM PULSE

(71) Applicant: Intel Corporation, Santa Clara, CA (US)

(72) Inventors: Nathan R Franklin, San Mateo, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/028,938

(22) Filed: Sep. 17, 2013

(65) Prior Publication Data

US 2015/0078075 A1    Mar. 19, 2015

(51) Int. Cl.
| | |
|---|---|
| *G11C 11/00* | (2006.01) |
| *G11C 13/00* | (2006.01) |
| *G11C 11/24* | (2006.01) |
| *G11C 11/56* | (2006.01) |

(52) U.S. Cl.
CPC ............ *G11C 13/0069* (2013.01); *G11C 11/24* (2013.01); *G11C 11/5642* (2013.01); *G11C 13/0004* (2013.01); *G11C 2013/0045* (2013.01); *G11C 2207/063* (2013.01)

(58) Field of Classification Search
CPC ........... G11C 13/0069; G11C 11/5642; G11C 11/24; G11C 2013/0045; G11C 2207/063; H01L 27/1255
USPC ...................... 365/148, 163, 161, 174, 189.16
See application file for complete search history.

(56) References Cited

U.S. PATENT DOCUMENTS 8,934,280 B1 *   1/2015   Kuo et al. ..................... 365/145

* cited by examiner

*Primary Examiner* — Fernando Hidalgo
(74) *Attorney, Agent, or Firm* — Forefront IP Lawgroup, PLLC

(57) ABSTRACT

Described herein are techniques related to one or more systems, apparatuses, methods, etc. for programming a memory cell through the use of a program pulse.

24 Claims, 6 Drawing Sheets

PROGRAMMING MEMORY CELLS USING A PROGRAM PULSE

BACKGROUND

Non-volatile memory (NVM) has pervaded many of the devices that we use each day, from the music of MP3 players, to the photos on digital cameras, to the stored e-mail messages in our smartphones, and to the files that we carry in our portable devices.

With the different NVMs in the current market, a phase change memory (PCM) NVM has made rapid progress in terms of sophisticated demonstrations of scaling to small device dimensions. The PCM typically exploits large resistance contrast between its amorphous and crystalline states in so-called phase change materials. The amorphous phase tends to have high electrical resistivity while the crystalline phase exhibits a low electrical resistivity, sometimes 3 or 4 orders of magnitude lower. Due to this large resistance contrast, the change in read current is large enough to open up an opportunity for multiple analog levels in the programming of the PCM.

Currently, prior to any programming pulse that is applied to the PCM, a separate read operation is performed in order to determine whether a further programming pulse is required. Typically, the separate read step may take about 50 nanoseconds to perform and the programming pulse step another 50 nanoseconds. The total operation taking about 100 nanoseconds.

Figure 1:
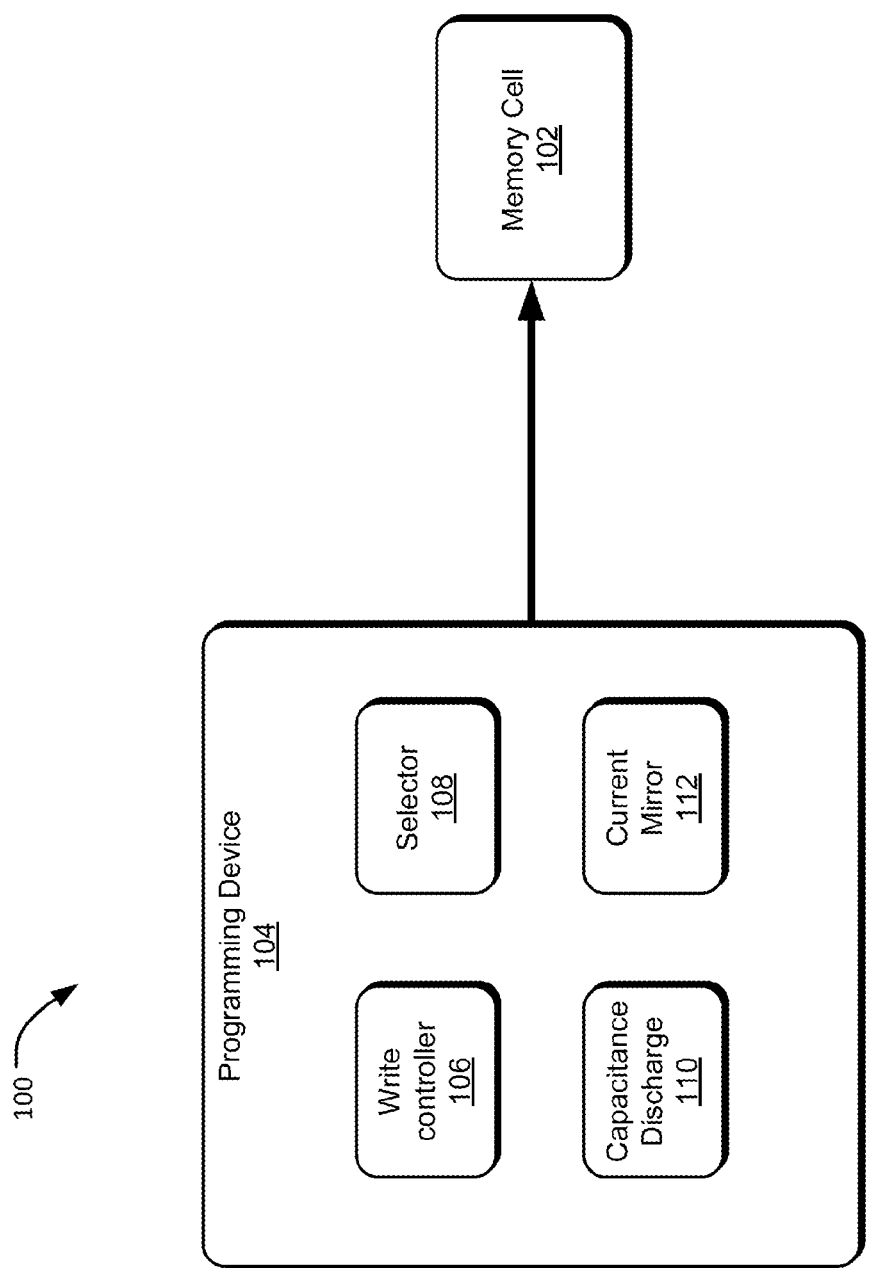
FIG. 1 is an example schematic diagram for programming a selected memory cell as described in present implementation.

The following Detailed Description is provided with reference to the accompanying figures. In the figures, the left-most digit(s) of a reference number usually identifies the figure in which the reference number first appears. The use of the same reference numbers in different figures indicates similar or identical items.

DETAILED DESCRIPTION

This document discloses one or more systems, apparatuses, methods, etc. for programming a memory cell through the use of a program pulse. The memory cell, for example, is a phase change memory (PCM) cell or other electronic threshold switch. The program pulse may be a capacitance-discharge current pulse or any other controlled current-pulse that may be applied to the memory cell by a programming device.

In an implementation, the programming device, which may implement a capacitor, may be used to provide the program pulse. For example, the programming device is connected to the memory cell or memory cells, and supplies the capacitance-discharge current pulse in order to facilitate the programming or storing of information to a selected memory cell(s).

To program a selected memory cell, a self-selecting voltage is applied to the selected memory cell. In an implementation, the applied voltage is at least equal to a desired minimum voltage threshold of the selected memory cell. In other words, to program the selected memory cell, the applied voltage is assumed to be greater than a present voltage threshold (Vth) of the selected memory cell. Applying a voltage greater than the Vth of the cell facilitates a thresholding of the selected memory cell, and passing of current through the memory cell.

With the application of the voltage, the voltage is compared to the present voltage threshold (Vth) of the selected memory cell. If the applied voltage is greater than the present Vth, then the selected memory cell is said to be thresholding. In other words, the selected memory cell is turned on and set for programming or storing of bits of information. Otherwise, if the applied voltage is less than the Vth, then the selected memory cell does not threshold and no program pulse is further applied. For example, if the memory cell does not threshold, then the current programming process does not occur. A program pulse is expected to be about 25 nanoseconds. In prior art program and verify routines, the routine may take 100 nanoseconds, which may include a 50 nanosecond program pule and a verify/read step that may take another 50 nanosecond. As discussed herein, the verify/read step takes place with the program place. Therefore, the total time for such an operation may be 25 nanoseconds.

A thresholding memory cell (e.g., a PCM cell) may switch or change its phase or material resistivity from a highly-resistive amorphous phase (i.e., RESET state) into a low-resistance crystallization state (i.e., SET state), or vice-versa. In between these states, multiple capacitance-discharge current pulses may be configured and utilized to facilitate the programming of multiple bits of information. Such a program pulse is expected to be about 25 nanoseconds. For example, multiple capacitance-discharge current pulses are configured to step-increase the material resistivity of the memory cell. In this example, the step-increase may correspond to different thresholding events or programming of the memory cell. Furthermore, the step-increase may provide different amounts of programming current to the memory cell. Since a capacitance discharge pulse is used, the current delivered in the discharge pulse is proportional to the Vth of the memory cell. Thus as the memory cell receives repeated capacitance discharge pulses the current delivered in these pulses continues to increase until the Vth of the memory cell exceeds the applied voltage of the pulse. Because the memory cell thresholds when the applied bias equals its Vth, the current delivered by the discharge pulse is dictated by the cell Vth not the applied bias. As discussed above, the thresholding events or programming of the memory cell is implemented as long as the applied voltage is greater than the present Vth. The present Vth in this case increases in value after each thresholding event.

FIG. 1 illustrates an example schematic diagram 100 for programming a selected memory cell as described in present implementation. The schematic diagram 100, for example, shows a basic schematic diagram of a programmable non-volatile memory cell 102 such as the PCM cell. The memory cell 102 may be a part of a memory component or an apparatus in a device, such as a wireless device. As shown, diagram programming device 104 includes a write controller 106, a selector 108, a capacitance discharge 110, and a current mirror 112.

In an implementation, the write controller 106 may drive the selector 108 to choose a particular memory cell 102 from an array of memory cells. The array of memory cells is typically a grid that includes a bit line and a word line, as further discussed below. For example, the selection of the particular memory cell 102 may include supplying of voltage potentials to a particular bit line and word line of the grid. In this example, the intersection of the bit line and the word line facilitates the location of the selected memory cell 102.

Furthermore, the write controller 106 may drive the capacitance discharge 110 to apply a capacitance-discharge current pulse to the memory cell 102. For example, the write controller 106 may control the timing and amount of the capacitance-discharge current pulse that is utilized to store information to the memory cell 102. In this example, the capacitance-discharge current pulse is applied when the memory cell 102 is at a programming state. In other words, the memory cell 106 is thresholding. The programmable state of the memory cell 102 is further discussed below in FIG. 2.

In an implementation, the memory cell 102 may be a phase change memory (PCM) cell or any other electronic threshold switch. For example, the PCM cell may change its phase or material resistivity during thresholding events. The capacitance-discharge current pulse from the capacitance discharge 108 may facilitate the change in phase or material resistivity of the memory cell 102. Different memory cells 102 may require different amounts of capacitance-discharge current pulses to change its phase or material resistivity. In other words, some memory cell(s) 102 may undergo few capacitance-discharge current pulses before they stop thresholding. To this end, the programming process of the memory cell(s) 102 stops.

As an example of present implementations herein, the current mirror 112 and the capacitance discharge 108 may effectively be viewed as the programming device 104 for the memory cell 102. In other words, the current mirror 112 and the capacitance discharge 108 may facilitate the application of the program pulse (i.e., capacitance-discharge current pulse).

In an implementation, the current mirror 112 may include an output of a diode transistor (not shown) that copies or mirrors a reference current from another diode transistor (not shown). For example, the other diode transistor is a biasing transistor for the separate diode transistor that produces the current mirror 112. In this example, the current mirror 112 may also be utilized to charge the capacitor of the capacitance discharge 110. Furthermore, the current mirror 112 may be utilized to set a level of the capacitance discharge 110 to continue until it self terminates when the cell Vth has exceeded the applied voltage. In other words, after the capacitance discharge 110 discharges the current-pulse to the memory cell 102 and then terminates, the current mirror 112 then facilitates flowing of a minimum current to recharge the capacitor to the desired applied voltage. The capacitor can then be discharged through the memory cell 102 if the applied voltage exceeds the memory cell Vth.

Figure 2:
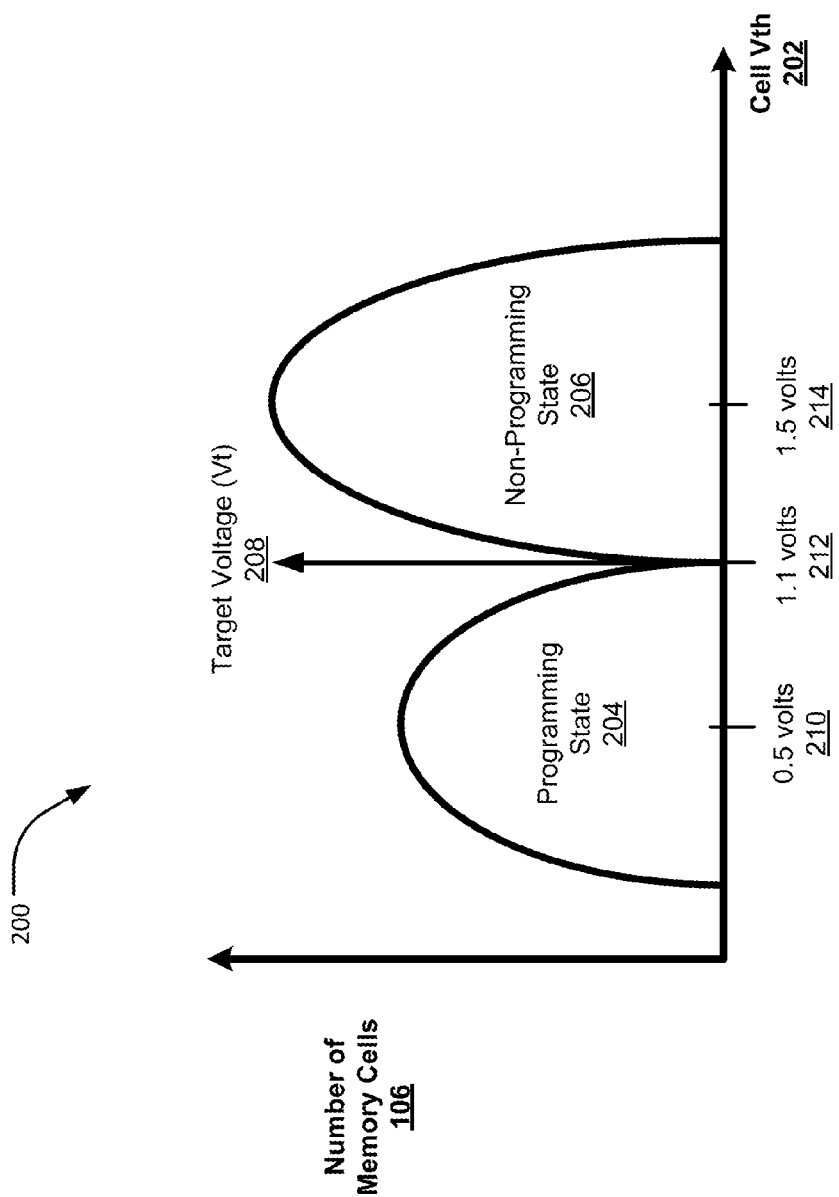
FIG. 2 is an example graph that shows a transition in configuration of a memory cell from a programmable state to a non-programmable state.

FIG. 2 illustrates an example graph 200 that shows a transition in configuration of the memory cell 102 from a programmable state to a non-programmable state. As shown, FIG. 2 portrays a memory cell voltage threshold (Vth) 202 plotted along an x-axis line, a number of memory cells 106 is plotted along a y-axis line. An area is defined as a programming state 204 and an area is defined as a non-programming state 206. An applied self-selecting target voltage (Vt) 208 is identified on the graph 200.

As an example of present implementations herein, the applied target voltage Vt 208 is a predetermined voltage potential that is utilized as a reference point for distinguishing the programming state 204 from the non-programming state 206 of a particular memory cell 106. In an implementation, the applied target voltage Vt 208 is assumed to include a value that is equal to a desired minimum Vth of the memory cell 106. In this implementation, the memory cell 102 may be assumed to be in programmable state 204 when the applied target voltage Vt 208 is less than or equal to the desired minimum Vth of the memory cell 102.

For example, a 1.1 volts 212 predetermined voltage potential (i.e., applied target voltage Vt 208) is applied to a particular memory cell 106 that includes a present Vth 202 of 0.5 volts 210. In this example, the present Vth 202 of the particular memory cell 102 is less than the applied target voltage Vt 208. As a result, the particular memory cell 102 is assumed to threshold and begin to be in programming state 204. In other words, the particular memory cell 102 is said to be thresholding and a capacitance discharge current pulse from the capacitance discharge 110 may flow into the memory cell 102. The capacitance-discharge current pulse, in this case, may be utilized to program a particular bit of information to the memory cell 102.

In between the present cell Vth 202 of 0.5 volts 210 and the applied voltage 208 of 1.1 volts, multiple step increases in the cell Vth 202 may be provided by capacitance-discharge current pulses. For example, after application of the capacitance-discharge current pulse, the present Vth 202 of 0.5 volts 210 will become 0.7 volts (i.e., newly increased Vth 202). Because the newly increased Vth 202 of 0.7 volts is still less than the applied voltage Vt 208 of 1.1 volts, another capacitance-discharge current pulse may be utilized to program the memory cell 106. This process may repeat until the newly increased Vth 202 is greater than the applied voltage Vt 208 of 1.1 volts. In other implementations, the duration of the current pulses may be increased, instead of voltage step increases.

In an implementation, the capacitance-discharge current pulse is implemented through the capacitance discharge 110 while the application of multiple capacitance discharge pulses (and increase in the Vth 202) is implemented through the current mirror 112. In this implementation, the capacitive current-pulse discharge alters or changes the phase or material resistivity of the memory cell 102.

In case of multiple program pulses during thresholding events, multiple bits of information may correspond to different phases or levels of material resistivity of the memory cell 102. These corresponding changes are facilitated by different amounts of capacitance-discharge current pulses from the capacitance discharge 110.

In an implementation, the change in the phase or material resistivity of memory cell 102 may remain the same throughout the operating life of the memory cell 102. In other words, the memory cell 102 may perform the function of a non-volatile memory. For example, a particular capacitive current-pulse discharge provides a particular change in the material resistivity of the memory cell 102, which is in the programming state (i.e., it is thresholding). In this example, the particular change in the material resistivity may represent the bit-status or information in the memory cell 106 throughout its operating life.

In a scenario where the applied voltage 208 (e.g., 1.1 volts 212) is less than the current Vth 202 (e.g., 1.5 volts 214) of the memory cell 102, the memory cell 106 is assumed to be in the non-programming state 206. In this scenario, no thresholding events occur, and the programming of the memory cell 102 does not occur. In another example, when the applied target voltage Vt 208 of 1.1V is already less than the cell Vth 202 of 1.5 volts 214 during the initial programming attempt, then the initial programming is discontinued and the memory cell 102 is left as it is.

During the non-programming state 206 (i.e., non-thresholding state) of the memory cell 102, a read operation may be performed by measuring an amount of current that flows into the memory cell 102. The measured amount of flowing current is a function of the material resistivity of the memory cell 102. To this end, the stored information may be deduced from the determined material resistivity of the memory cell 102. For example, the flowing current is supplied by the current mirror 112. In this example, the supplied flowing current is measured to determine the information that may have been stored during the programming 204 of the memory cell 102.

Figure 3:
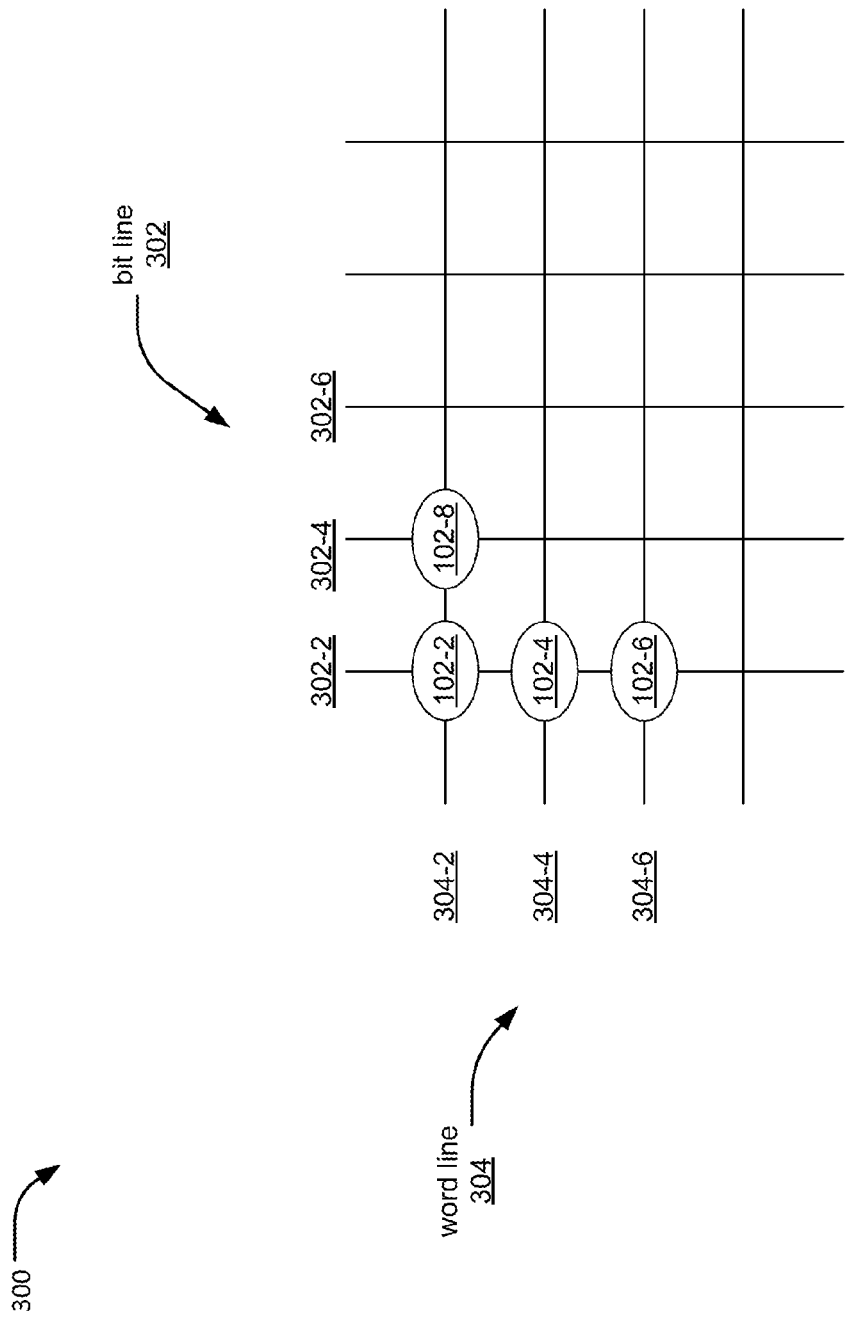
FIG. 3 is an example schematic diagram of a memory array grid to implement selection of a programmable memory cell.

FIG. 3 illustrates an example memory grid array 300 to implement selection of the memory cell 102 as described in present implementation. As shown, the grid 300 includes a bit line 302, a word line 304, and memory cells 102 at different cross-points in the memory grid array 300.

In an implementation, a particular memory cell 102 is programmed to store and retain bit information throughout its operating life. Similarly, a read operation may be performed on the particular memory cell 102 to identify the stored and retained information. In both of these instances, a selection of the particular memory cell 102 in the memory grid array 300 is performed before the programming or read activity is performed.

As an example of present implementations herein, the particular memory cell 106 in the memory grid array 300 is selected by supplying a voltage potential or an electrical current to the bit line 302 and the word line 304. For example, the memory cell 102-2 is selected by supplying the voltage potential to bit line 302-2 and a word line 304-2. In this example, the selected memory cell 102-2 is a cross-point between the bit line 302-2 and the word line 304-2. Referring back to FIG. 1, in an implementation, the selector 108 may utilize transistors (not shown) in supplying the voltage potential or the electrical current to the memory cell(s) 102.

Figure 4:
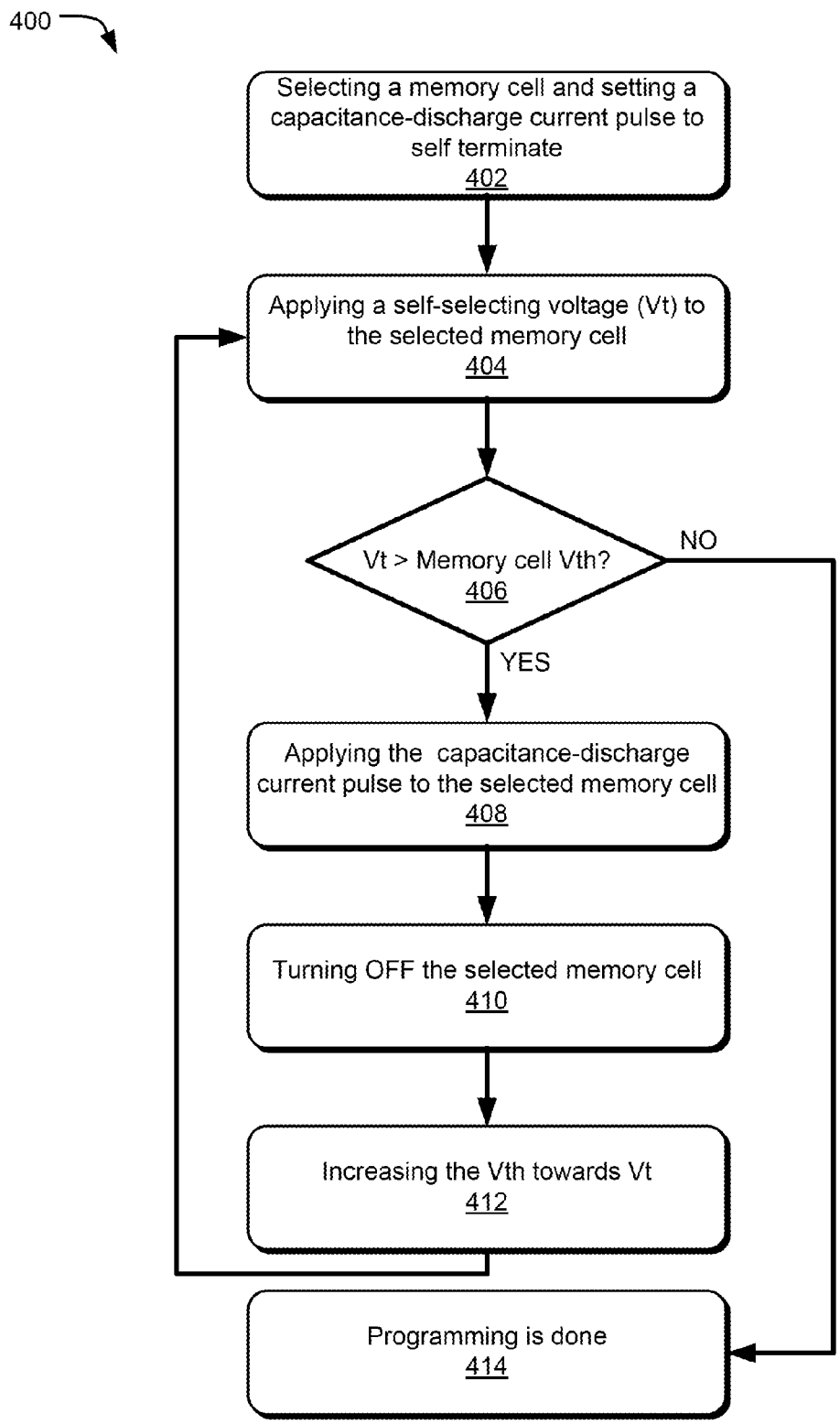
FIG. 4 is an example process chart illustrating a method for programming a memory cell by utilizing a capacitance-discharge current pulse.

FIG. 4 shows an example process chart 400 illustrating an example method for programming a memory cell by utilizing a capacitance-discharge current pulse. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, selecting a memory cell (e.g., memory cell 102) and setting a capacitance-discharge current-pulse to a level where the capacitance-discharge current-pulse self terminates. In an implementation, the selection of the memory cell is performed by supplying a voltage potential across a bit line (e.g., bit line 302) and a word line (e.g., word line 304). A cross-point between the bit line 302 and the word line 304 is the selected memory cell. With the selected memory cell, the capacitance-discharge current-pulse that it may receive from a capacitance discharge (e.g., capacitance discharge 110) may be set to the level where the current-pulse self-terminates. In other words, the level of capacitance-discharge current pulse includes a minimum amount of current to eventually force the selected memory cell to OFF state. But a current mirror (e.g., current mirror 112) may allow for recharging of a capacitor and the voltage across the memory cell. If the applied voltage exceeds the cell Vth (e.g., cell Vth 202), the selected memory cell thresholds again and receives another capacitance discharge pulse.

At block 404, applying a self-selecting applied target voltage Vt (e.g., Vt 208) to the selected memory cell is performed. In an implementation, the applied target voltage Vt (e.g., Vt 208) is configured and utilized as a reference voltage in determining whether the memory cell is in programming state (e.g. programming state 204) or non-programming state (non-programming state 206). In this implementation, the applied target voltage Vt includes a desired minimum memory cell voltage threshold.

In an implementation, a particular memory cell 102 may threshold a few times at a particular amount of applied target voltage while another memory cell may not threshold at all at the same amount of applied target voltage Vt. In other words, the amount of applied target voltage Vt may be configured to be not too low or not too high in value during the programming of the memory cells.

At block 406, determining if the applied target voltage is greater than a threshold voltage Vth (e.g., Vth 202) of the selected memory cell is performed. For example, if a present threshold voltage Vth of the memory cell is less than applied target voltage, then following the YES branch of block 406, at block 408, the memory cell is determined to be thresholding and programmed Otherwise, following the NO branch of block 406, at block 414, the programming is done or ended.

At block 408, applying a capacitance-discharge current pulse to the memory cell is performed. For example, a capacitance discharge (e.g., capacitance discharge 108) may supply the capacitance-discharge current pulse (i.e., program pulse) to the thresholding memory cell. The capacitance discharge may provide a predetermined amount of current-pulse that is discharged by a capacitor to alter a material resistivity of the memory cell. For multiple current-pulses discharged during the thresholding events, each capacitance-discharge current pulse may be utilized to store bit of information to the memory cell 106 by changing the phase or material resistivity of the memory cell. In certain implementations, the duration of the current pulse may be increased or decreased.

In an implementation, the amount of capacitance-discharge current pulse at different thresholding events is configured to step-increase the alteration of the phase or material resistivity of the memory cell. In this implementation, the different resistivity may correspond to different voltage thresholds. Furthermore, the thresholding events or programming may continue until a newly increased voltage threshold is higher than the applied target voltage Vt.

At block 410, turning OFF a flow of current through the selected memory cell is performed. After each application of the capacitance-discharge current pulse during the thresholding events, the flow of current through the memory cell 102 is turned OFF due to integration of the read operation to the program pulse. In an implementation a current mirror (e.g., current mirror 112) is configured to facilitate the turning OFF of the memory cell.

At block 412, increasing the threshold voltage Vth towards the applied target voltage Vt is performed. For example, with each thresholding event, a current mirror (e.g., the current mirror 110) is configured to facilitate the increasing of the threshold voltage Vth towards the applied target voltage Vt. In this example, the increasing of the threshold voltage Vth may be based or caused by the capacitance-discharge current pulse. Furthermore, the increasing of the threshold voltage Vth may provide the newly increased voltage threshold that is compared to the applied voltage 208 at a subsequent thresholding event. The process 400 goes back to block 404 until the applied voltage 208 is lesser than the newly increased threshold voltage Vth.

At block 414, the programming of the memory cell is ended. For example, if the applied target voltage Vt 208 is less than the threshold voltage Vth, then the capacitance-discharge current pulse may not flow into the memory cell. The total time for process 400 may be about 25 nanoseconds. Application of the self-selecting voltage, block 414, may include a read/write operation.

Figure 5:
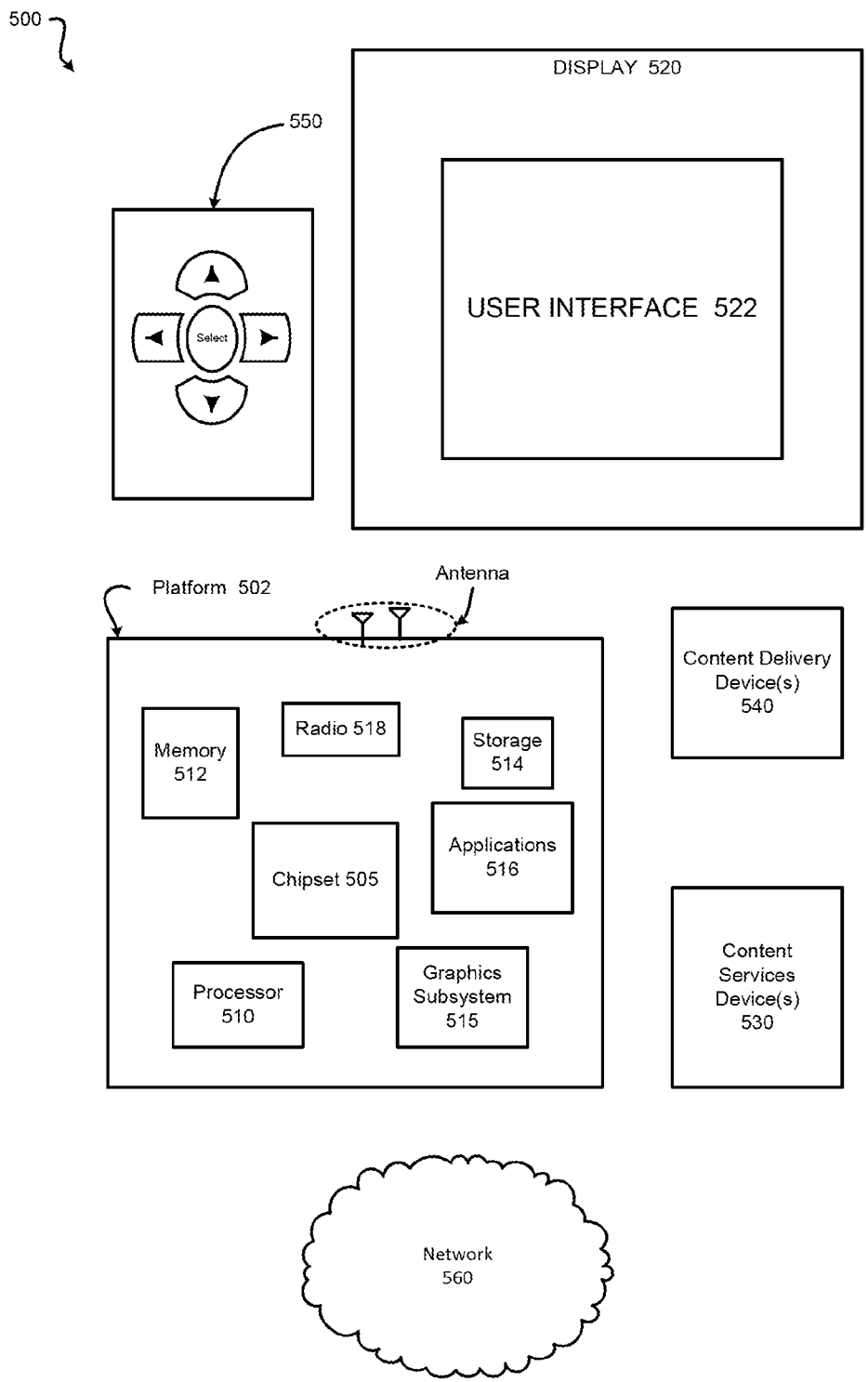
FIG. 5 is a schematic diagram of an example computing device to implement a method for programming a memory cell by utilizing a capacitance-discharge current pulse.

FIG. 5 illustrates an example system 500 in accordance with the present disclosure. For example, the schematic diagram 100 utilizes the example system 500. In various implementations, the system 500 may be a media system although system 500 is not limited to this context. For example, system 500 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In various implementations, system 500 includes a platform 502 coupled to a display 520. Platform 502 may receive content from a content device such as content services device(s) 530 or content delivery device(s) 540 or other similar content sources. A navigation controller 550 including one or more navigation features may be used to interact with, for example, platform 502 and/or display 520. Each of these components is described in greater detail below.

In various implementations, platform 502 may include any combination of a chipset 505, processor 510, memory 512, storage 514, graphics subsystem 515, applications 516 and/or radio 518. Chipset 505 may provide intercommunication among processor 510, memory 512, storage 514, graphics subsystem 515, applications 516 and/or radio 518. For example, chipset 505 may include a storage adapter (not depicted) capable of providing intercommunication with storage 514.

Processor 510 may be implemented as a Complex Instruction Set Computer (CISC) or Reduced Instruction Set Computer (RISC) processors, x86 instruction set compatible processors, multi-core, or any other microprocessor or central processing unit (CPU). In various implementations, processor 510 may be dual-core processor(s), dual-core mobile processor(s), and so forth.

Memory 512 may be implemented as a non-volatile memory device such as, the PCM memory cell. In an implementation, the memory 512 is coupled to the processor 510, which may act as the write controller 102.

Storage 514 may be implemented as another non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 514 may include technology to increase the storage performance enhanced protection for valuable digital media when multiple hard drives are included, for example.

Graphics subsystem 515 may perform processing of images such as still or video for display. Graphics subsystem 515 may be a graphics processing unit (GPU) or a visual processing unit (VPU), for example. An analog or digital interface may be used to communicatively couple graphics subsystem 515 and display 520. For example, the interface may be any of a High-Definition Multimedia Interface, Display Port, wireless HDMI, and/or wireless HD compliant techniques. Graphics subsystem 515 may be integrated into processor 510 or chipset 505. In some implementations, graphics subsystem 515 may be a stand-alone card communicatively coupled to chipset 505.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general-purpose processor, including a multi-core processor. In further embodiments, the functions may be implemented in a consumer electronics device.

Radio 518 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 518 may operate in accordance with one or more applicable standards in any version.

In various implementations, display 520 may include any television type monitor or display. Display 520 may include, for example, a computer display screen, touch screen display, video monitor, television-like device, and/or a television. Display 520 may be digital and/or analog. In various implementations, display 520 may be a holographic display. In addition, display 520 may be a transparent surface that may receive a visual projection. Such projections may convey various forms of information, images, and/or objects. For example, such projections may be a visual overlay for a mobile augmented reality (MAR) application. Under the control of one or more software applications 516, platform 502 may display user interface 522 on display 520.

In various implementations, content services device(s) 530 may be hosted by any national, international and/or independent service and thus accessible to platform 502 via the Internet, for example. Content services device(s) 530 may be coupled to platform 502 and/or to display 520. Platform 502 and/or content services device(s) 530 may be coupled to a network 560 to communicate (e.g., send and/or receive) media information to and from network 560. Content delivery device(s) 540 also may be coupled to platform 502 and/or to display 520.

In various implementations, content services device(s) 530 may include a cable television box, personal computer, network, telephone, Internet enabled devices or appliance capable of delivering digital information and/or content, and any other similar device capable of unidirectionally or bidirectionally communicating content between content providers and platform 502 and/display 520, via network 560 or directly. It will be appreciated that the content may be communicated unidirectionally and/or bidirectionally to and from any one of the components in system 500 and a content provider via network 560. Examples of content may include any media information including, for example, video, music, medical and gaming information, and so forth.

Content services device(s) 530 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 502 may receive control signals from navigation controller 550 having one or more navigation features. The navigation features of controller 550 may be used to interact with user interface 522, for example. In embodiments, navigation controller 550 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 550 may be replicated on a display (e.g., display 520) by movements of a pointer, cursor, focus ring, or other visual indicators displayed on the display. For example, under the control of software applications 516, the navigation features located on navigation controller 550 may be mapped to virtual navigation features displayed on user interface 522, for example. In embodiments, controller 550 may not be a separate component but may be integrated into platform 502 and/or display 520. The present disclosure, however, is not limited to the elements or in the context shown or described herein.

In various implementations, drivers (not shown) may include technology to enable users to instantly turn on and off platform 502 like a television with the touch of a button after initial boot-up, when enabled, for example. Program logic may allow platform 502 to stream content to media adaptors or other content services device(s) 530 or content delivery device(s) 540 even when the platform is turned "off." In addition, chipset 505 may include hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various implementations, any one or more of the components shown in system 500 may be integrated. For example, platform 502 and content services device(s) 530 may be integrated, or platform 502 and content delivery device(s) 540 may be integrated, or platform 502, content services device(s) 530, and content delivery device(s) 540 may be integrated, for example. In various embodiments, platform 502 and display 520 may be an integrated unit. Display 520 and content service device(s) 530 may be integrated, or display 520 and content delivery device(s) 540 may be integrated, for example. These examples are not meant to limit the present disclosure.

In various embodiments, system 500 may be implemented as a wireless system, a wired system, or a combination of both. When implemented as a wireless system, system 500 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 500 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 502 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 5.

As described above, system 500 may be embodied in varying physical styles or form factors. FIG. 5 illustrates implementations of a small form factor device 500 in which system 500 may be embodied. In embodiments, for example, device 500 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

Figure 6:
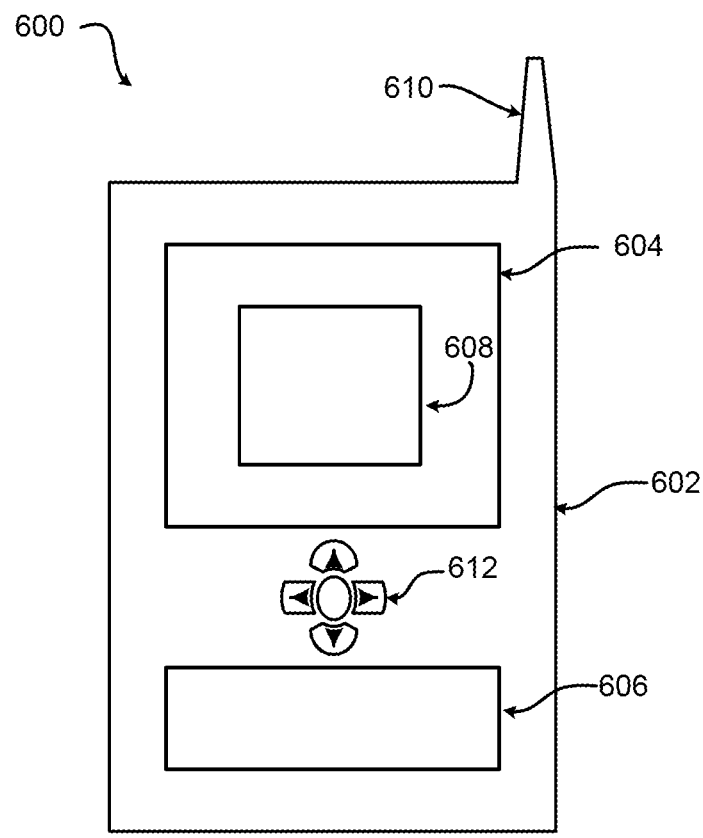
FIG. 6 is a schematic diagram of an example device to implement a method for programming a memory cell by utilizing a capacitance-discharge current pulse.

As shown in FIG. 6, device 600 may include a housing 602, a display screen 604, an input/output (I/O) device 606, a network interface card (NIC) 608 and a transceiver component 610. Device 600 also may include navigation features 612. The display screen 604 may include any suitable display unit for displaying information appropriate for a mobile computing device. For example, the display screen 604 displays the personalized message that the personalized communication program may generate. The I/O device 606 may include any suitable I/O device or user interface (UI) for entering information into a mobile computing device such as when the user 102 opts-in to the personalized communication program. Examples for I/O device 606 may include an alphanumeric keyboard, a numeric keypad, a touch pad, input keys, buttons, switches, rocker switches, microphones, speakers, voice recognition device and software, and so forth. Information also may be entered into device 600 by way of microphone (not shown). Such information may be digitized by a voice recognition device (not shown). The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

The following examples pertain to further embodiments:

Example 1 is a method of programming a memory cell comprising: applying a self-selecting voltage to a selected memory cell, wherein the applied voltage includes a desired minimum memory cell voltage threshold; determining if the applied voltage is greater than a voltage threshold of the selected memory cell; in response to the determination that the applied voltage is greater than the voltage threshold, applying a capacitance discharge current pulse to program the selected memory cell; turning OFF a flow of current through the selected memory cell after the application of the capacitance-discharge current pulse; increasing the voltage threshold of the selected memory cell towards the applied voltage.

In Example 2, the method as recited in example 1, further comprising selecting the memory cell, wherein the selection includes supplying a voltage potential to a bit line and a word line that are connected to the selected memory cell, wherein the memory cell is a phase change memory (PCM) cell.

In Example 3, the method as recited in example 1, further comprising setting the capacitance-discharge current pulse to a level where the capacitance-discharge current pulse self terminates, wherein the flow of current during the self-termination includes a limit to the maximum current such that as the capacitance is discharged, the memory cell turns off.

In Example 4, the method as recited in example 1, wherein each capacitance discharge current pulse during a thresholding event corresponds to a particular bit of information that is stored and retained by the selected memory cell, the capacitance-discharge current pulse is configured to facilitate a step-increase of the voltage threshold towards the applied voltage.

In Example 5, the method as recited in example 1, further comprising: ending the programming of the memory cell if the applied voltage is less than a newly increased memory cell voltage threshold, wherein the newly increased memory cell voltage threshold is greater than the desired minimum memory cell voltage threshold.

In Example 6, the method as recited in example 1, wherein the turning OFF of the flow of current through the memory cell is facilitated by a current mirror, the current mirror is further configured to facilitate increasing of recharging the capacitor to yield potentially another capacitance discharge pulse if the cell voltage threshold has not exceed the applied voltage, and if the cell voltage threshold has exceeded the applied voltage then no thresholding will occur and no capacitance discharge pulse will flow and the cell voltage threshold will be unchanged.

In Example 7, the method as recited in example 1, wherein the turning OFF of the memory cell is utilized to perform a read operation that is integrated with the programming operation.

In Example 8, a programming device to program a memory cell with an an applied self-selecting voltage, wherein the applied self-selecting voltage includes a desired minimum memory cell voltage threshold, comprising: a write controller configured to determine if the applied self-selecting voltage is greater than a voltage threshold of the memory cell; a capacitance discharge configured to apply a capacitance-discharge current pulse to program the memory cell in response to the determination that the applied self-selecting voltage is greater than the voltage threshold; and a current mirror configured to turn OFF a flow of current through the memory cell after the application of the capacitance-discharge current pulse, wherein the current mirror is further configured to facilitate increasing of the voltage threshold of the memory cell towards the applied self-selecting voltage.

In example 9, the programming device as recited in claim 8, further comprising a selector driven by the writer controller to perform a selecting of the memory cell, wherein the selector supplies a voltage potential to a bit line and a word line that are connected to the memory cell.

In example 10, the programming device as recited in claim 8, wherein the write controller is further configured to set the capacitance discharge current pulse to a level where the capacitance discharge current pulse self terminates.

In example 11, the programming device as recited in claim 8, wherein the write controller is further configured to end the program of the memory cell in response to the determination that the applied self-selecting voltage is less than a newly increased voltage threshold of the memory cell.

In example 12, the programming device as recited in claim 8, wherein the memory cell is a phase change memory (PCM) cell.

In example 13, the programming device as recited in claim 8, wherein the capacitance discharge supplies multiple capacitance-discharge current pulses during multiple thresholding events, wherein each capacitance-discharge current pulse corresponds to a particular bit of information that is stored and retained by the memory cell.

In example 14, the apparatus as recited in claim 8, wherein the turning OFF of the memory cell is utilized to perform a read operation that is integrated with the program of the memory cell.

Example 15 is a programmable memory cell comprising: an input to to receive an applied self-selecting voltage that is compared to a voltage threshold of the memory cell, wherein the memory cell receives a capacitance-discharge current pulse in response to a determination that the applied self-selecting voltage is greater than the voltage threshold, wherein the memory cell is turned OFF after the application of the capacitance-discharge current pulse and the voltage threshold of the memory cell is configured to increase towards the applied self-selecting voltage.

In example 16, the programmable memory cell as recited in claim 15, wherein the applied self-selecting voltage includes a desired minimum memory cell voltage threshold.

In example 17, the programmable memory cell as recited in claim 15, wherein each capacitance-discharge current pulse during thresholding events corresponds to a particular bit of information that is stored and retained by the memory cell.

In example 18, the programmable memory cell as recited in claim 15, wherein the memory cell is selected by receiving a voltage potential from a connected bit line and a connected word line.

In example 19, the programmable memory cell as recited in claim 15, wherein the programmable memory cell is configured to receive input to from a write controller configured to end programming of the memory cell if the applied self-selecting voltage is less than a newly increased memory cell voltage threshold.

In example 20, the programmable memory cell as recited in claim 15, wherein the programmable memory cell is configured to receive a current from a current mirror to increase the voltage threshold towards the applied self-selecting voltage.

In Example 21, one or more processor-readable media having encoded thereon processor-executable instructions that, when executed by one or more processors, direct a performance of operations, the operations comprising: selecting a memory cell from a memory array; applying a self-selecting voltage to the selected memory cell, wherein the applied voltage includes a desired minimum memory cell voltage threshold; determining if the applied voltage is greater than a voltage threshold of the selected memory cell; in response to the determination of the applied voltage that is greater than the voltage threshold, applying a capacitance-discharge current pulse to program the selected memory cell; turning OFF a flow of current through the selected memory cell after the application of the capacitance-discharge current pulse; increasing the voltage threshold towards the applied voltage, wherein the increase in the voltage threshold is caused by the capacitance-discharge current pulse.

In Example 22, the one or more processor-readable media as recited in example 21, wherein the selecting includes supplying a voltage potential to a bitline and a wordline that are connected to the selected memory cell, wherein the memory cell is a phase change memory (PCM) cell.

In Example 23, the one or more processor-readable media as recited in example 21, wherein each capacitance-discharge current pulse during thresholding events corresponds to a particular bit of information that is stored and retained by the memory cell.

In Example 24, the one or more processor-readable media as recited in example 21, further comprising setting the capacitance-discharge current pulse to a level where the capacitance-discharge current pulse self terminates.

In Example 25, the one or more processor-readable media as recited in example 21, further comprising: ending the programming of the memory cell if the applied voltage is less than a newly increased memory cell voltage threshold.

In Example 26, the one or more processor-readable media as recited in example 21, wherein the turning OFF of the flow of current through the memory cell is facilitated by a current mirror.

What is claimed is:

1. A method of programming a memory cell comprising:
   applying a voltage to a selected memory cell;
   determining if the applied voltage is greater than a voltage threshold of the selected memory cell;
   in response to the determination that the applied voltage is greater than the voltage threshold, applying a capacitance discharge current pulse to program the selected memory cell;
   turning OFF a flow of current through the selected memory cell after the application of the capacitance-discharge current pulse to perform a read operation on the programmed selected memory cell; and
   increasing the voltage threshold of the selected memory cell towards the applied voltage, wherein the increased voltage threshold is utilized for a subsequent programming of the memory cell.

2. The method of claim 1, wherein the applying a voltage is performed by increasing current pulse duration.

3. The method as recited in claim 1, further comprising selecting the memory cell, wherein the selection includes supplying a voltage potential to a bit line and a word line that are connected to the selected memory cell, wherein the memory cell is a phase change memory (PCM) cell.

4. The method as recited in claim 1, further comprising setting the capacitance discharge current pulse to a level where the capacitance-discharge current pulse self terminates, wherein the flow of current during the self-termination includes a limit to the maximum current such that as the capacitance is discharged, the memory cell turns off.

5. The method as recited in claim 1, wherein each capacitance discharge current pulse during a thresholding event corresponds to a particular bit of information that is stored and retained by the selected memory cell, the capacitance-discharge current pulse is configured to facilitate a step-increase of the voltage threshold towards the applied voltage.

6. The method as recited in claim 1, further comprising ending the programming of the memory cell if the applied voltage is less than a newly increased memory cell voltage threshold.

7. The method as recited in claim 1, wherein the turning OFF of the flow of current through the memory cell is facilitated by a current mirror, the current mirror is further configured to facilitate increasing of recharging the capacitor to yield potentially another capacitance discharge pulse if the cell voltage threshold has not exceed the applied voltage, and if the cell voltage threshold has exceeded the applied voltage then no thresholding occur and no capacitance discharge pulse will flow and the cell voltage threshold will be unchanged.

8. The method as recited in claim 1, wherein the turning OFF of the memory cell is utilized to perform the read operation that is integrated with the programming operation.

9. The method of claim 1, wherein the method takes place at about 25 nanoseconds.

10. A programming device to program a memory cell with an applied voltage, wherein the applied voltage includes a desired minimum memory cell voltage threshold, the programming device comprising:
    a write controller configured to determine if the applied voltage is greater than a voltage threshold of the memory cell;
    a capacitance discharge configured to apply a capacitance-discharge current pulse to program the memory cell in response to the determination that the applied voltage is greater than the voltage threshold; and
    a current mirror configured to turn OFF a flow of current through the memory cell after the application of the capacitance-discharge current pulse, wherein the current mirror is further configured to facilitate increasing of the voltage threshold of the memory cell towards the applied voltage.

11. The programming device as recited in claim 10, further comprising a selector driven by the write controller to perform a selecting of the memory cell, wherein the selector supplies a voltage potential to a bit line and a word line that are connected to the memory cell.

12. The programming device as recited in claim 10, wherein the write controller is further configured to set the capacitance discharge current pulse to a level where the capacitance discharge current pulse self terminates.

13. The programming device as recited in claim 10, wherein the write controller is further configured to end the program of the memory cell in response to the determination that the applied voltage is less than a newly increased voltage threshold of the memory cell.

14. The programming device as recited in claim 10, wherein the memory cell is a phase change memory (PCM) cell.

15. The programming device as recited in claim 10, wherein the capacitance discharge supplies multiple capacitance-discharge current pulses during multiple thresholding events, wherein each capacitance-discharge current pulse corresponds to a particular bit of information that is stored and retained by the memory cell.

16. The programming device as recited in claim 10, wherein the capacitance discharge supplies current pulses of increasing duration.

17. The programming device as recited in claim 10, wherein the turning OFF of the memory cell is utilized to perform a read operation that is integrated with the program of the memory cell.

18. A programmable memory cell comprising:
    an input to receive an applied voltage that is compared to a voltage threshold of the memory cell, wherein the memory cell receives a capacitance-discharge current pulse in response to a determination that the applied voltage is greater than the voltage threshold, wherein a flow of current to the memory cell is turned OFF after the application of the capacitance-discharge current pulse to perform a read operation on the memory cell and the voltage threshold of the memory cell is configured to increase towards the applied voltage, wherein the increased voltage threshold is utilized for programming the memory cell.

19. The programmable memory cell as recited in claim 18, wherein the applied voltage includes a desired minimum memory cell voltage threshold.

20. The programmable memory cell as recited in claim 18, wherein the capacitance discharge current pulse increases in duration to reach the voltage threshold.

21. The programmable memory cell as recited in claim 18, wherein each capacitance-discharge current pulse during thresholding events corresponds to a particular bit of information that is stored and retained by the memory cell.

22. The programmable memory cell as recited in claim 18, wherein the memory cell is selected by receiving a voltage potential from a connected bit line and a connected word line.

23. The programmable memory cell as recited in claim 18, wherein the programmable memory cell is configured to receive input to from a write controller configured to end programming of the memory cell if the applied voltage is less than a newly increased memory cell voltage threshold.

24. The programmable memory cell as recited in claim 18, wherein the programmable memory cell is configured to receive a current from a current mirror to increase the voltage threshold towards the applied voltage.

* * * * *